US010874028B2

(12) United States Patent
Joo et al.

(10) Patent No.: US 10,874,028 B2
(45) Date of Patent: Dec. 22, 2020

(54) SMART WALL

(71) Applicant: LG ELECTRONICS INC., Seoul (KR)

(72) Inventors: Junghyun Joo, Seoul (KR); Junghan Ryu, Seoul (KR); Taeho Kim, Seoul (KR); Youngkyoung Kim, Seoul (KR); Chulmin Lim, Seoul (KR); Bumsang Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/776,306

(22) Filed: Jan. 29, 2020

(65) Prior Publication Data
US 2020/0344910 A1 Oct. 29, 2020

(30) Foreign Application Priority Data

Apr. 29, 2019 (KR) .................. 10-2019-0049980
Apr. 29, 2019 (KR) .................. 10-2019-0049981

(51) Int. Cl.
*G06F 1/16* (2006.01)
*H05K 7/18* (2006.01)
(Continued)

(52) U.S. Cl.
CPC ............ *H05K 7/18* (2013.01); *E04C 2/46* (2013.01); *F16M 13/027* (2013.01); *H04N 5/645* (2013.01); *H04R 1/025* (2013.01)

(58) Field of Classification Search
CPC ............ H05K 7/0017; H05K 7/1488; E04B 2002/7483; G06F 1/1652
See application file for complete search history.

(56) References Cited

U.S. PATENT DOCUMENTS 5,924,779 A * 7/1999 Krumholz ............ A47B 88/42
211/151
6,230,445 B1 * 5/2001 Arko .................. E04B 2/7416
211/90.02
(Continued)

FOREIGN PATENT DOCUMENTS

DE 2149177 4/1972
GB 1370645 10/1974
(Continued)

OTHER PUBLICATIONS

European Patent Office Application Serial No. 20150180.6, Search Report dated Jul. 23, 2020, 9 pages.

*Primary Examiner* — Anthony Q Edwards
(74) *Attorney, Agent, or Firm* — Lee, Hong, Degerman, Kang & Waimey PC

(57) ABSTRACT

Disclosed herein is a smart wall including a plurality of frame modules including at least one mounting cell, a fastener configured to fasten the plurality of frame modules to each other to form a frame structure, a fixing member configured to fix the frame structure to a ceiling and a floor, an electronic appliance disposed in the mounting cell, and an art wall configured to cover a front surface of the frame structure, wherein the plurality of frame modules includes at least one of a first frame module including mounting cells arranged side by side in a horizontal direction, a second frame module including a mounting cell larger than the mounting cells of the first frame module, or a third frame module having a length corresponding to a vertical length of the frame structure and including mounting cells arranged side by side in a vertical direction.

19 Claims, 16 Drawing Sheets

(51) Int. Cl.
*H04R 1/02* (2006.01)
*H04N 5/645* (2006.01)
*E04B 2/00* (2006.01)
*F16M 13/02* (2006.01)

(56) References Cited

U.S. PATENT DOCUMENTS

| | | | | |
|---|---|---|---|---|
| 6,301,837 B1 * | 10/2001 | Ray | ............... | E04F 15/02411 211/189 |
| 6,851,226 B2 * | 2/2005 | MacGregor | ............... | A47B 83/001 52/220.7 |
| 7,337,024 B1 * | 2/2008 | Graham | ............... | A47B 81/061 160/239 |
| 7,562,949 B1 * | 7/2009 | Nielsen | ............... | A47B 45/00 312/107 |
| 7,866,622 B2 * | 1/2011 | Dittmer | ............... | F16M 11/10 248/421 |
| 8,970,795 B2 * | 3/2015 | Lemieux | ............... | A47B 81/06 312/7.2 |
| 9,273,473 B2 * | 3/2016 | Millson | ............... | H04N 5/64 |
| D753,943 S * | 4/2016 | Gosling | ............... | E04B 2/745 D6/703 |
| 10,433,439 B2 * | 10/2019 | Pecorino | ............... | H05K 5/03 |
| 2003/0154673 A1 * | 8/2003 | MacGregor | ............... | E04B 2/7422 52/239 |
| 2012/0145654 A1 * | 6/2012 | McGowan | ............... | A47B 81/06 211/26 |
| 2012/0194750 A1 * | 8/2012 | Carr | ............... | H04R 1/028 348/841 |
| 2012/0255921 A1 * | 10/2012 | Franklin-Lees | ............... | H05K 7/1488 211/26 |
| 2015/0033642 A1 * | 2/2015 | Johnson | ............... | E04F 19/08 52/173.1 |
| 2015/0211228 A1 * | 7/2015 | Gosling | ............... | A47B 3/00 52/36.4 |
| 2016/0135323 A1 * | 5/2016 | Haroun | ............... | G06F 1/181 361/679.53 |
| 2016/0168863 A1 * | 6/2016 | Kwan | ............... | E04F 13/0805 52/36.5 |
| 2017/0367198 A1 * | 12/2017 | Park | ............... | H01L 51/5237 |

FOREIGN PATENT DOCUMENTS

| | | |
|---|---|---|
| WO | 2012109739 | 8/2012 |
| WO | 2017034806 | 3/2017 |

* cited by examiner (a)                    (b)

(a)

(b)

(c)

(a)

(b)

(a)

(b)

(a)

(b)

(a)

(b)                (c)

(a)

(b)

SMART WALL

Pursuant to 35 U.S.C. § 119(a), this application claims the benefit of earlier filing date and right of priority to Korean Patent Application Nos. 10-2019-0049980, filed on Apr. 29, 2019 and 10-2019-0049981, filed on Apr. 29, 2019, the contents of which are all hereby incorporated by reference herein in their entirety.

BACKGROUND

Field

The present disclosure relates to a wall on which a multimedia device, such as a TV and a loudspeaker, and a home appliance are mounted, and a unitized smart wall.

Discussion of the Related Art

Recently, as the infrastructure in which all media devices and home appliances at home beyond the smartphone are connected to the Internet is built, the smart home is emerging as a keyword of a new smart ecosystem. In particular, user experiences and values accumulated through smartphones, which are personal media devices, have begun to expand to other devices.

As various attempts such as building a home network system were made in order to make media devices and home appliances to interoperate with each other, the number of electronic devices at home has increased and there is a hassle of connecting the devices one by one.

In particular, it is a recent trend to minimize the number of pieces of furniture and electronics that are placed near the living room wall, around which the TV is usually placed, to keep a neat appearance of the living room wall, which represents the house. In addition, where there are children in a house, they may be pushed over or bumped and injured due to a TV table or a loudspeaker placed in the living room. Therefore, it is important to reduce the number of pieces of furniture and electronics protruding into the space of the living room.

SUMMARY OF THE DISCLOSURE

An object of the present disclosure is to provide a smart wall unitized by mounding multimedia devices, such as a TV and a loudspeaker on a wall, and home appliances.

In one aspect of the present disclosure, a smart wall may include a plurality of frame modules including at least one mounting cell, a fastener configured to fasten the plurality of frame modules to each other to form a frame structure, a fixing member configured to fix the frame structure to a ceiling and a floor, an electronic appliance disposed in the mounting cell, and an art wall configured to cover a front surface of the frame structure, wherein the plurality of frame modules may include at least one of a first frame module including mounting cells arranged side by side in a horizontal direction, a second frame module including a mounting cell larger than the mounting cells of the first frame module, or a third frame module having a length corresponding to a vertical length of the frame structure and including mounting cells arranged side by side in a vertical direction.

The first frame module and the second frame module may be stacked in the vertical direction, wherein a horizontal length of the first frame module may be equal to a horizontal length of the second frame module.

A sum of an integer multiple of a vertical length of the first frame module and a vertical length of the second frame module may correspond to a vertical length of the third frame module.

Each of the frame modules may be formed by arranging, in a grid, a pair of pieces of vertical steel disposed in the vertical direction and a piece of horizontal steel between the pair of pieces of vertical steel, wherein the vertical steel and the horizontal steel may be C-shape steel having a C-shaped cross-section formed by bending both width ends thereof twice.

The fixing member may include a fixing bracket fixed to the ceiling or floor, a coupling bracket coupled to the fixing bracket, and a first vertical bracket extending in the vertical direction from the coupling bracket and inserted into the vertical steel of the first frame module and the second frame module, wherein the first vertical bracket may be fastened to the first frame module and the second frame module.

The third frame module may be disposed on a side of a stack of the first frame module and the second frame module, wherein the fixing member may further include a second vertical bracket inserted into the vertical steel of the third frame module.

The mounting cells of the first frame module and the third frame module may include at least one of a first mounting cell, a second mounting cell having a horizontal dimension equal to an integer multiple of a horizontal dimension of the first mounting cell, or a third mounting cell having a vertical dimension equal to an integer multiple of a vertical dimension of the first mounting cell.

The second mounting cell may be provided in the first frame module, and the third mounting cell may be provided in the third frame module.

The smart wall may further include an outlet module positioned on a lateral surface of the mounting cell, and a basket inserted into the mounting cell, the basket being open forward of the frame structure and including an opening formed in a lateral surface thereof to expose the outlet module.

The smart wall may further include a first hook formed on the frame structure, and a second hook formed on the basket and fastened to the first hook.

The first hook may be disposed on one side of the outlet module, and wherein the second hook may be disposed outside the basket so as to be adjacent to the opening of the basket.

The second hook may be hinged to the basket, wherein one side of the second hook may be arranged outside of the basket and fastened to the first hook, and an opposite side of the second hook may be arranged inside the basket, wherein, when a user applies force to the second hook, the one side of the second hook may be separated from the first hook.

The smart wall may further include a pair of roller modules positioned at one side and an opposite side of the mounting cell of the second frame, a chain wound around the pair of roller modules and configured to move according to rotation of the roller, and a flexible display coupled to the chain and having a first the surface to output an image, the image being output while one side and another side of the flexible display being moved in opposite directions, wherein a position of the flexible display may be switched between a first state and a second state, wherein, in the first state, the first surface may face forward of the frame structure, and wherein, in the second state, a second surface of flexible display opposite to the first surface may face forward of the frame structure.

In the second state, the second surface is positioned in the same plane as the art wall.

The smart wall may further include C-shape steel having a C-shaped cross-section formed by bending both width ends thereof twice, the C-shape steel including an internal space open at one end thereof toward the mounting cell.

The internal space may include a pair of first internal spaces surrounded in a square bracket shape at both ends of the C-shape steel, and a second internal space located between the pair of first internal spaces and including an opening open to the mounting cell, and an outlet module inserted into the second internal space and including an power outlet facing the mounting cell.

The outlet module may include a base module connected to a cable for supplying external power, and a power unit including the power outlet and fastened to the base module to supply power to a power plug inserted into the power outlet, wherein the power unit may include a plurality of power units stacked in a longitudinal direction of the C-shape steel.

The outlet module may further include a data unit including a data port allowing a data plug to be inserted thereinto for data communication, wherein the data unit may be arranged on a side of the power unit and stacked on top of the base module.

A vertical length of the power unit may correspond to an integer (N) multiple of a vertical length of the data unit, wherein the data unit may include N data units stacked on a side of one of the power units.

The outlet module may further include a wing laterally extending from an outside of the opening so as to abut an outer surface of the C-shape steel.

The smart wall may further include a rail located in the first internal space and including a cable groove extending in the longitudinal direction of the C-shape steel, wherein the rail include a plurality of rails arranged side by side in a lateral direction of the C-shape steel.

A smart wall according to the present disclosure may be installed on a wall at the same height as a multimedia device such as a TV or an audio device mounted thereon, and may therefore provide a tidy appearance.

The size of the smart wall may vary depending on the installation site, and therefore may be customized.

The smart wall may be modularized, thereby facilitating mounting of any appliance. When a repair is needed, only a module may be easily removed. Thus, installation and maintenance are simple. Additionally, when a multimedia device or an appliance is added, the smart wall may be easily extended by adding a unit.

Further, it is not necessary to move away unused seasonal appliances into a separate mounting cell, which is advantageous in terms of securing space.

Further scope of applicability of the present disclosure will become apparent from the detailed description below. Various changes and modifications within the spirit and scope of the present disclosure may be clearly understood by those skilled in the art, and therefore, the detailed description and specific embodiments, such as preferred embodiments of the present disclosure, should be understood as given by way of example only.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DISCLOSURE

Hereinafter, exemplary embodiments disclosed herein will be described in detail with reference to the accompanying drawings. The same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In the following description of the embodiments of the present disclosure, a detailed description of known technology will be omitted to avoid obscuring the subject matter of the present disclosure. The accompanying drawings are intended to facilitate understanding of the embodiments disclosed herein, and should not be construed as limiting the technical idea disclosed in the present specification. The disclosure is to cover all modifications, equivalents, and alternatives falling within the spirit and scope of the embodiments.

Terms including ordinal numbers such as first, second, etc. may be used to explain various elements. However, it will be appreciated that the elements are not limited to such terms. These terms are merely used to distinguish one element from another.

Stating that one constituent is "connected" or "linked" to another should be understood as meaning that the one constituent may be directly connected or linked to another constituent or another constituent may be interposed between the constituents. On the other hand, stating that one constituent is "directly connected" or "directly linked" to another should be understood as meaning that no other constituent is interposed between the constituents.

As used herein, the singular forms "a", "an", and "the" include plural referents unless context clearly dictates otherwise.

In this specification, terms such as "includes" or "has" are intended to indicate existence of characteristics, figures, steps, operations, constituents, components, or combinations thereof disclosed in the specification. The terms "includes" or "has" should be understood as not precluding possibility of existence or addition of one or more other characteristics, figures, steps, operations, constituents, components, or combinations thereof.

Figure 1:
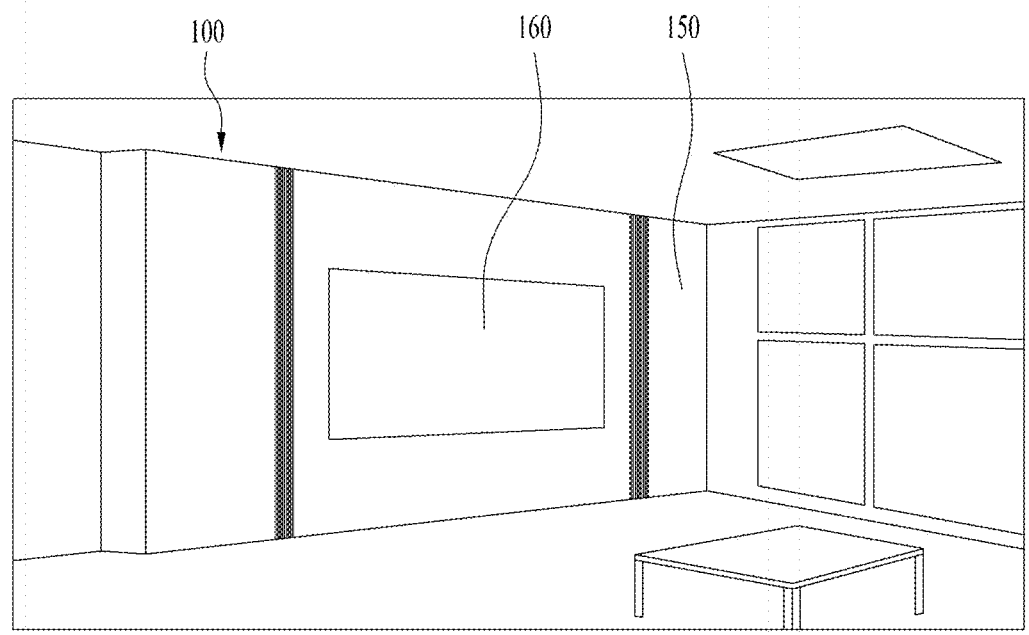
FIG. 1 is a view illustrating an installation example of a smart wall of the present disclosure.

FIG. 1 is a view showing a wall-type frame of a smart wall 100 of the present disclosure. The present disclosure relates to a smart wall 100 systemized by integrating electronic devices used at home, such as media devices and home appliances, with a wall so as not to be exposed through the exterior of the smart wall. The present disclosure provides a total space solution that minimizes the exposure of electronic devices in a space by mounting various electronic devices such as a display, an interphone, a loudspeaker, an air purifier, a humidifier, a light, a digital clock, a router, and a set-top box on a wall.

Recently, the thickness of a display device 161 has become thin. Thus, the smart wall 100 of the present disclosure may be formed to have a the thickness of 15 to 20 cm, thereby preventing the interior space from being narrowed during installation. Rather, the storage furniture and a home appliance 160 may be embedded in the smart wall 100 to provide a neat appearance. When necessary, a part of the wall may be selectively drawn out to allow a necessary home appliance to protrude from the wall, and the space where the home appliances are not embedded may be used as a mounting cell 114 for an item such as a drawer.

Recently, it has become possible to design a thin TV, and thus a thin display is implementable. Accordingly, the TV itself may serve as a cover of a frame and may be coupled to the frame to define a front appearance. An opening 153 may be formed in an art wall 151 to expose the display of the display device 161. A cover to open and close the opening 153 may be further provided.

A display employing organic light-emitting diodes (OLED) is bendable, and therefore it may be exposed to the outside only when used and may be rolled up and kept inside the wall when not in use, thereby providing a tidy screen by appearance.

Regarding projectors, a unifocal projector has recently been developed. This projector may be mounted on the wall and drawn out like a drawer to output images on a screen, thereby implementing a large screen. In this case, when the projector is in use, the display is unseeable from the outside of the smart wall 100, and therefore may provide a tidier appearance.

Figure 2:
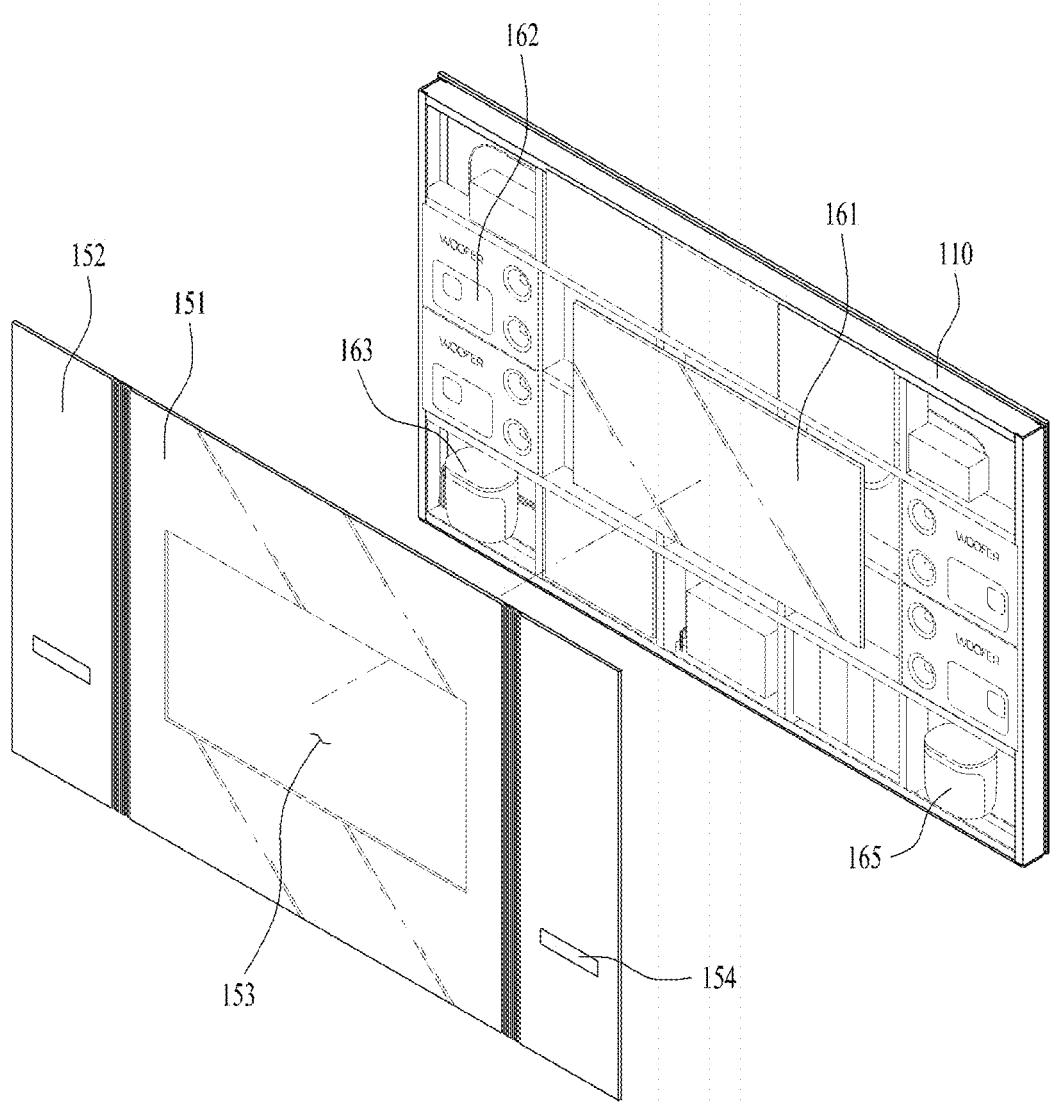
FIG. 2 is an exploded perspective view of the smart wall according to an embodiment of the present disclosure.

FIG. 2 is an exploded view of the smart wall 100 of the present disclosure. A frame structure formed by a plurality of pieces of shape steel arranged in a grid form may be disposed inside the art wall 150, which is the front. The frame structure 110 is a rigid member. The frame structure 110 may support the wall so as not to collapse even when an impact is applied to the wall. A panel may be attached to the front of the frame structure 110 to hide the electronic appliance 160 mounted on the frame structure 110, thereby looking like a wall. The front wall covered with such a panel is called an art wall 150.

The art wall 150 may be changed according to the preference of the consumer. The art wall 150 may be easily changed after being installed to change the mood of the home.

The shape steel 115 arranged in a grid form may partition the mounting cell 114, and seat the electronic appliance 160 in each of the partitioned mounting cells 114. The partitioned mounting cells 114 may have the same size or sizes which are multiples of a size. Thus, the electronic appliance 160 to be mounted may be modularized and disposed at any position in the frame structure 110.

In addition to the display device 161 described above, a sound device 152 such as a loudspeaker 162 may be mounted in the mounting cell 114. Multiple sound devices 152 may be configured according to the number of channels. The art wall 152 covering the sound device may be configured in a mesh form to allow sound to be output, or may selectively open and close the openings through which the sound is output, such that the openings exposed to the outside are minimized. To prevent infiltration of water, the openings may be formed using a waterproof mesh or the like.

A dehumidifier 163, a humidifier 165, an air conditioner, a stove, and the like, which are seasonal household appliances, may be provided. Leaving the seasonal appliances exposed to the outside when not in use may cause dust to accumulate on the appliances and undermine the appearance. Thus, the seasonal appliances are usually kept in a storage area with a cover put thereon when they are not in use. When such appliances are embedded in the smart wall 100 in the present disclosure, they may be covered with the art wall 150 so as not to be exposed to the outside when they are not used, and therefore the need for the separate mounting cell 114 may be eliminated.

The dehumidifier 163 or the humidifier 165 may implement a drawer type space for collecting/storing water to remove collected water or supply water. Openings 154 through which air passes are needed to discharge water or to collect moisture in the surroundings. An air cleaner may be installed at a lower end of the smart wall 100 to allow a user to easily open the air cleaner to periodically replace the filter with a new one.

The openings 154 may not be necessarily formed in the art wall 150, but a gap between the art wall 150 and the frame structure 110 may be used.

In addition, when a set-top box or a Wi-Fi router is provided, a home network system may be implemented. a not only functional units mounted on the smart wall 100 but also other electronic devices such as a computer or a mobile terminal located outside the smart wall 100 may be connected via the Wi-Fi router and controlled in an interworking manner.

An LED or a small display panel may be arranged on an upper portion of the smart wall to provide a user with simple information such as weather, time, event information, or may be used as lighting. A light may be provided to the smart wall 100 to obtain an interior effect.

When different communication schemes or signals are used between the devices, the router serves as an intermediate device to coordinate the schemes or signals and guide a path. In addition, a functional unit mounted on the smart wall 100 may be connected and controlled via a WIFI router, rather than being connected by wire.

The router also serves to connect an external network and the internal network to each other. Accordingly, the user staying outside may control the router connected to the external network to control not only the functional units mounted on the smart wall 100 but also as home appliances and media devices connected to the internal network.

In addition, the electronic devices of the smart wall 100 may be controlled in operative connection with a mobile device. That is, when the mobile device is mounted on the smart wall 100, media images and music on the mobile device may be output. In addition, when a video call is received through the mobile device, the image of the other party may be provided through the display of the smart wall 100.

In addition, a wall pad connected to a camera or security system of the front door may be provided in the mounting cell 114 of the smart wall 100. The wall pad embedded in the existing bearing wall is difficult to repair and replace in case of failure, and there is a difficulty in changing the location thereof. However, when the wall pad is configured in a unit form and provided in the smart wall 100, maintenance thereof is easy.

The smart wall 100 may be installed in a room as well as the living room. The wall between the rooms may be configured as the smart wall 100 to use the smart wall 100 in both directions in neighboring rooms. For example, one air conditioner or air purifier may be used in both spaces when it is arranged to be reachable in both directions. Instead of the TV and loudspeaker 162 used in the living room, a monitor and a personal computer (PC) may be mounted and used based on the purpose of the room. Alternatively, another functional unit such as an electronic board may be mounted and used according to the age of a child.

When installed in an office, a smart wall 100 equipped with functional units such as an electronic board, an air purifier, a video conference system, and a PC may be used. The electronic appliance 160 mounted on the smart wall 100 is covered by the art wall 150 and thus do not require a separate exterior case.

When the smart wall 100 is installed after being manufactured at a factory according to a user's installation location, large quantities of the same module may be manufactured and supplied to a hotel/resort or apartment under construction, thereby reducing defect rate and manufacturing costs.

However, it is difficult to transport the smart wall 100 that has been assembled. Further, when construction of a building is completed, it is difficult to bring the smart wall 100 into the building. Accordingly, when the smart wall 100 is installed at the time of movement into an existing building or remodeling of the interior, the smart wall 100 may be implemented by installing a frame in the building and inserting a unit module. In this case, for ease of installation and standardization, the frame structure 110 may be implemented using a plurality of module frames.

Figure 3:
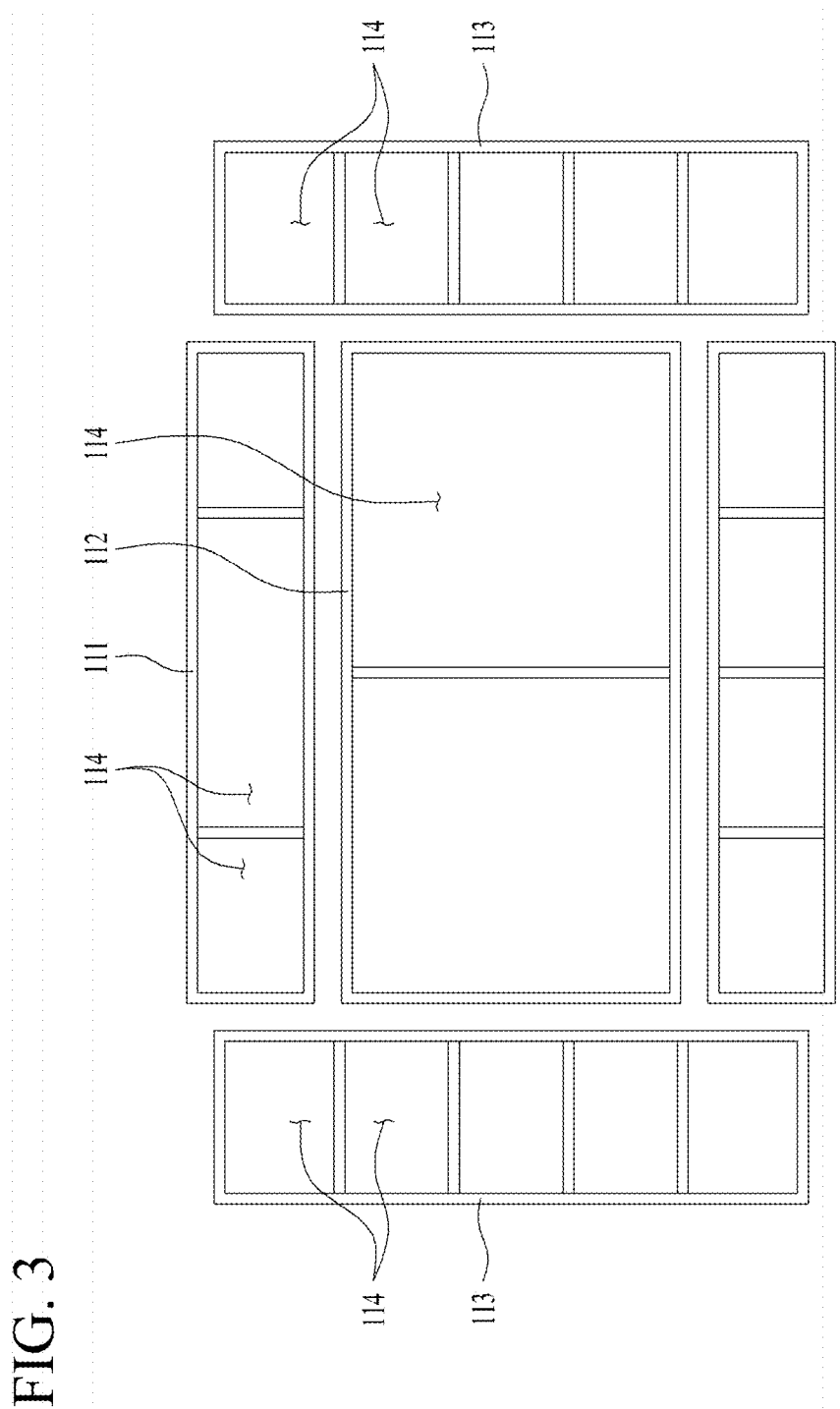
FIG. 3 is a view illustrating a configuration of frames of the smart wall according to an embodiment of the present disclosure.

FIG. 3 is a view illustrating coupling of frame modules 111, 112, and 113 of the smart wall 100 according to an embodiment of the present disclosure. In order to mount each component, bookcase-type frame modules 111, 112, and 113 including the mounting cell 114 may be used. In order to partition the mounting cell 114, the frame modules 111, 112, and 113 may be manufactured by arranging a plurality of beam-shaped members in a grid form.

The frame modules 111, 112, and 113 may include a first frame module 111 having mounting cells 114 arranged side by side in a horizontal direction, a second frame module 112 provided to mount a large appliance 160 such as the display device 161, a third frame module 113 having mounting cells 114 arranged side by side in a vertical direction.

Figure 4:
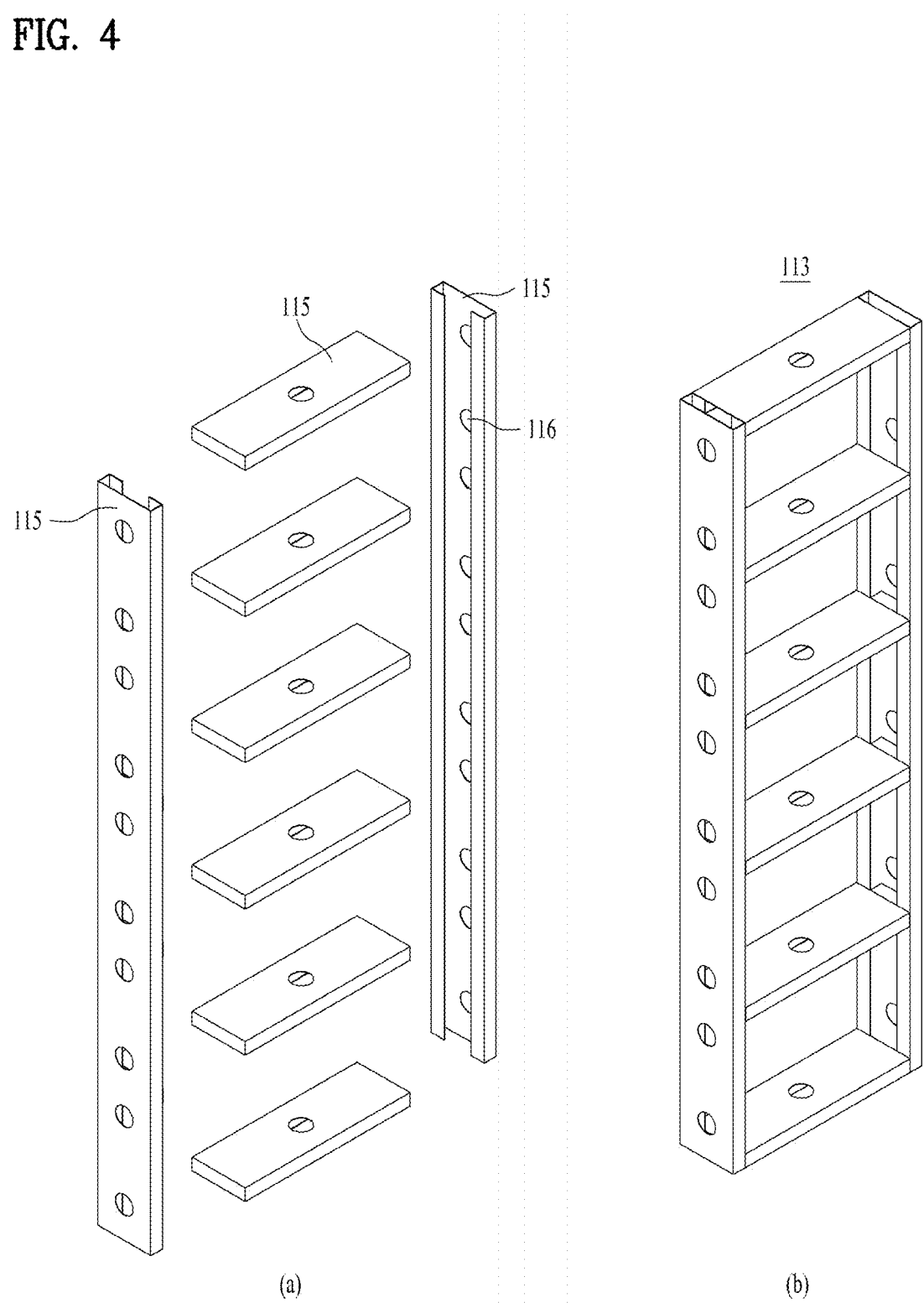
FIG. 4 shows examples of various frame structures according to a combination of frame modules of the present disclosure.

The second frame module 112 includes a large space to allow the display device 161 of any size to be mounted therein. When necessary, as shown in FIG. 4, beams to partition the mounting cell 114 may be provided to fix the display device 161 and to enhance rigidity of the frame structure 110.

The first frame module 111 and the second frame module 112 may be stacked in a vertical direction. The horizontal length of the first frame module 111 may be the same as the horizontal length of the second frame module 112. Thus, when the modules are stacked in the vertical direction, they may be disposed so as not to be misaligned.

The first frame module 111 may be disposed both over and under the second frame module 112. The number of first frame modules 111 stacked in the vertical direction may be increased or decreased depending on the sizes of the first frame module 111 and the second frame module 112 or the size of the installation space.

The third frame module 113, in which the mounting cells 114 are arranged side by side in the vertical direction, may have the same height as that of the first frame module 111 and the second frame module 112 stacked in the vertical direction. As shown in FIG. 4, the third frame module 113 may be located on the lateral sides of the first frame module 111 and the second frame module 112. The frame modules 111, 112, and 113 may be coupled with fasteners to form the frame structure 110 having a rectangular parallelepiped shape.

FIG. 4 is a view illustrating a method of manufacturing the frame modules 111, 112, and 113 of the present disclosure. The third frame module 113 in which the mounting cells 114 are arranged in the vertical direction will be described as an example. Each of the frame modules 111, 112, and 113 may be formed using the shape steel 115 extending in one direction. The shape steel is a structural member and represents all rod-shaped members having various cross-sectional shapes. Rod-shaped steel having the same cross section in the longitudinal direction may be formed by rolling or by bending a sheet material. The shape steel has a hollow space compared to a beam-shaped member having a circular or rectangular cross section. Thus, it is a lightweight member obtaining rigidity greater than or equal to a predetermined value with a little amount of material.

As shown in FIG. 4, the present disclosure may employ C-shape steel 115 having a C-shaped cross section. The C-shape steel 115 may be formed by vertically bending both width ends of a metal plate. When both ends of the metal plate are vertically bent only once, the plate may have a square bracket-shaped cross section. When both ends of the metal plate are vertically bent twice, the plate may have a C-shaped cross section. A power line or signal line connected to the electronic appliance 160 may be disposed in the internal space of the steel, and an outlet module 140 to which a power cable or a data cable is fastened may be disposed.

The outlet module 140 may include a power terminal for supplying power, a data terminal for data transmission and reception such as an Internet line or a cable input, and a connector by which a functional unit inserted into the frame is connected to another functional unit. The connector has terminals on both sides of the frame. When data connection lines of electronic devices are inserted into the terminals, the devices may exchange data with each other. The outlet module 140 may include a rail structure that moves along the frame modules 111, 112, and 113.

A vent hole 116 may be formed in the shape steel 115 as shown in FIG. 4. The vent hole 116 may reduce the weight of the shape steel 115 and discharge heat generated from the electronic appliance 160. A fan may also be used to discharge hot air to the outside to more actively discharge heat. When the heat of the electronic appliance 160 is discharged into an indoor space, a heating effect may be obtained in winter. However, in summer, discharging the heat into the indoor space may cause the indoor temperature to rise. Thus, the fan may be used to internally circulate heat, or a structure to discharge heat to the outside may be added to the wiring connected to the outdoor unit of the air conditioner.

Each of the frame modules 111, 112, and 113 may include outer steel defining a rectangular outer periphery and an inner steel arranged therein to partition the mounting cell 114. The outer steel may include vertical steel extending in the vertical direction and horizontal steel extending in the horizontal direction. The first frame module 111 to the third frame module 113 may be assembled by arranging the horizontal steel between a pair of vertical steels. In order to fasten the vertical steel with a fixing member 120, which is fixed to the ceiling and the floor, the upper and lower ends of the vertical steel may need to be exposed. Therefore, the vertical steel may be arranged outside the horizontal steel may be fastened by inserting vertical brackets 122 and 123 of the fixing member 120 to the end of the vertical steel (See FIG. 6).

The inner steel positioned inside the outer steel may define the mounting cell 114 by partitioning a space surrounded by the outer steel. The inner steel may be immovably connected to the outer steel by welding, and part of the inner steel may be bolted or hooked so as to be removed when necessary.

Thus, by fascinating the frame modules 111, 112, and 113 in the form of a semi-finished appliance 160 in the above-described manner, the number of connection operations to be performed on the site may be reduced. The dimensions of the appliance 160 may be kept constant and the installation time may be reduced. In addition, the product may be modularized into a size that facilitates movement of the product, and therefore may be easily moved to the site.

Figure 5:
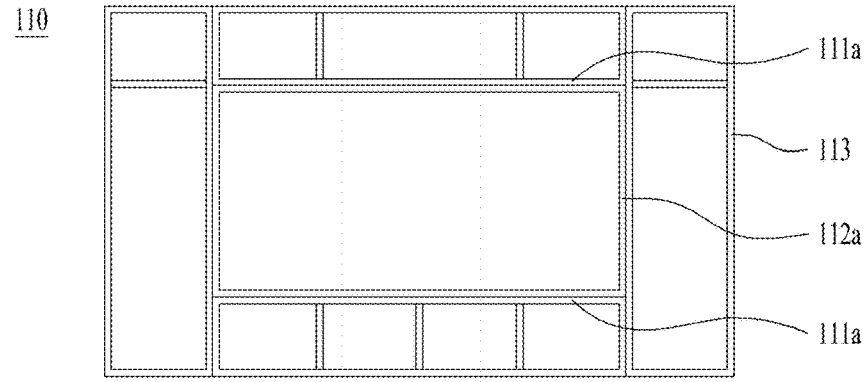
FIG. 5 is a view illustrating a frame module of the smart wall according to an embodiment of the present disclosure.
Figure 5:
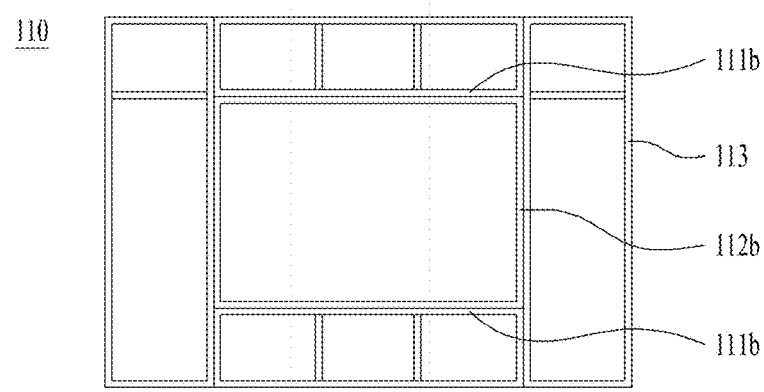
Figure 5:
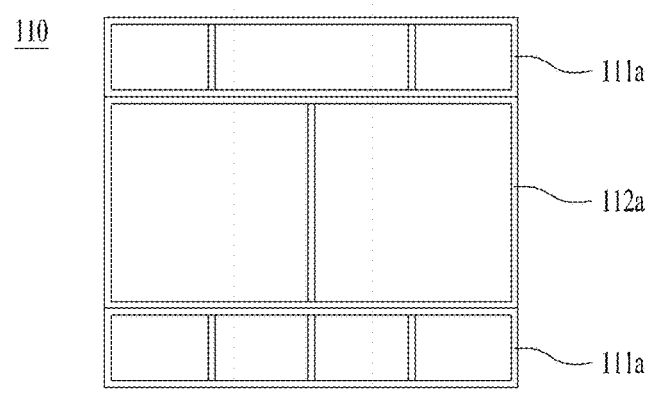

FIG. 5 shows examples of various frame structures 110 according to a combination of the frame modules 111, 112, 113 of the present disclosure. FIG. 5(a) illustrates assembly of a frame structure 110 consisting of a pair of first frame modules 111a, one second frame module 112a, and a pair of third frame modules 113. Since the first frame module 111a has four mounting cells 114, the width of the first frame module 111a may not fit to a narrow indoor space for installation.

Accordingly, as shown in FIG. 5(b), a first frame module 111b having three mounting cells 114 to have a short horizontal length may be used. The second frame module 112b may have a length corresponding to the horizontal length of the first frame module 111b.

In addition, the third frame modules 113 may be disposed on both sides of the vertical stack of the first frame module 111 and the second frame module 112. The height of a typical house is 220 cm to 230 cm, the third frame module 113 may be configured to have a height a little less than 220 cm. While a five-stage vertical frame is illustrated in the drawings, a six-stage vertical frame may be manufactured in case of a multilayer house or a house having a great floor height.

When installed in a narrower space, the frame structure 110 may be configured using only the first frame module 111a and the second frame module 112a without the third frame module 113. When a large display device 161 is not mounted, only the third frame modules may be arranged in a line to implement the frame structure 110. Each frame module 111, 112, 113 may be fastened by bolts, or may be fastened by welding.

Figure 6:
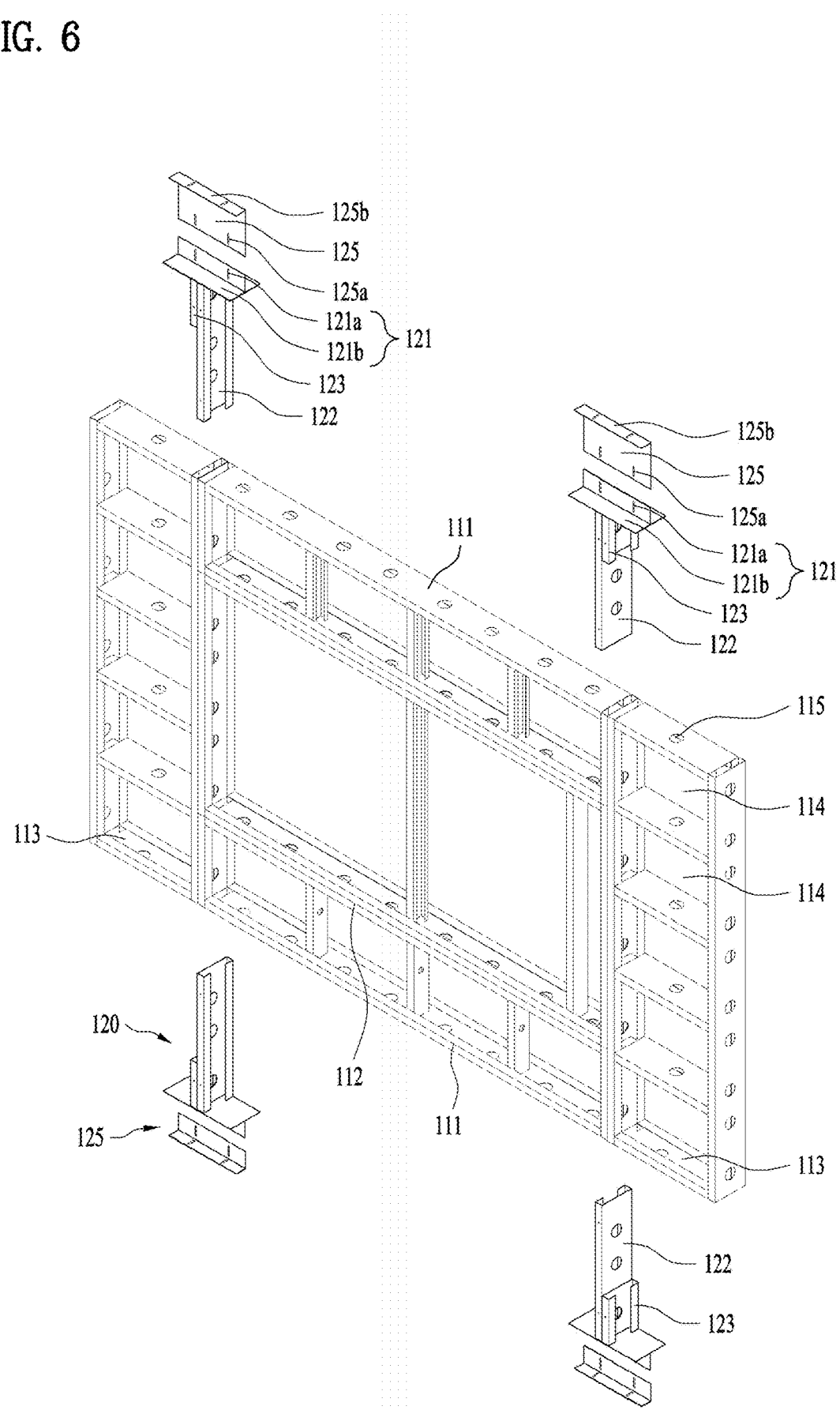
FIG. 6 is a view illustrating a method of installing a frame structure of the smart wall according to an embodiment of the present disclosure.

FIG. 6 is a view illustrating a method of installing a frame structure 110 of the smart wall 100 according to an embodiment of the present disclosure. The frame structure 110 formed by fastening the frame modules 111, 112, and 113 may be fixed to the ceiling and the floor so as to be installed in an indoor space.

The fixing bracket 125, which is installed on the ceiling or the floor, is a member bent in an L shape. One side 125b of the fixing bracket 125 is disposed on the ceiling or the floor, and the opposite side 125a thereof vertically extends from the ceiling or the floor. The frame structure may include a first vertical bracket 122 inserted into an internal space of the vertical steel thereof.

The first vertical bracket 122 may be formed to be longer than the vertical length of the first frame module 111 to fasten not only the first frame module 111 but also the second frame module 112. The frame structure may further include a second vertical bracket 123 disposed in parallel with the first vertical bracket 122 and inserted into the third frame module 113. Since the vertical steel of the third frame module 113 is one member, the vertical steel does not need to be as long as the first vertical bracket 122.

A coupling bracket 121 may be coupled to an end of each of the first vertical bracket 122 and the second vertical bracket 123 to form a T-shape together with the vertical brackets 122 and 123. The coupling bracket 121 may include a seating portion 121b coupled to the vertical brackets 122 and 123 and seated on the top surfaces of the first frame module 111 and the third frame module 113, and a fastening portion 121a vertically extending from the seating portion 121b and fastened to the fixing bracket 125. The coupling bracket 121 and the fixing bracket 125 may be fastened to each other using a screw, and may each have a fastening hole, which the screw is fastened. The fastening hole may be vertically elongated such that the brackets may be adjusted according to the ceiling height.

When the smart wall 100 is installed on the existing wall, a fixing member 120 may be further provided to fasten the smart wall to the existing wall.

A sound device such as the loudspeaker 162 is positioned on the smart wall 100. Accordingly, when the smart wall 100 is used as a temporary wall, spaces separated by the wall are formed. In this case, the smart wall 100 may be fixed by adding a soundproof structure to prevent sound from leak to the two spaces through the ceiling, the floor, and the sidewalls which are in contact with the smart wall 100.

Figure 7:
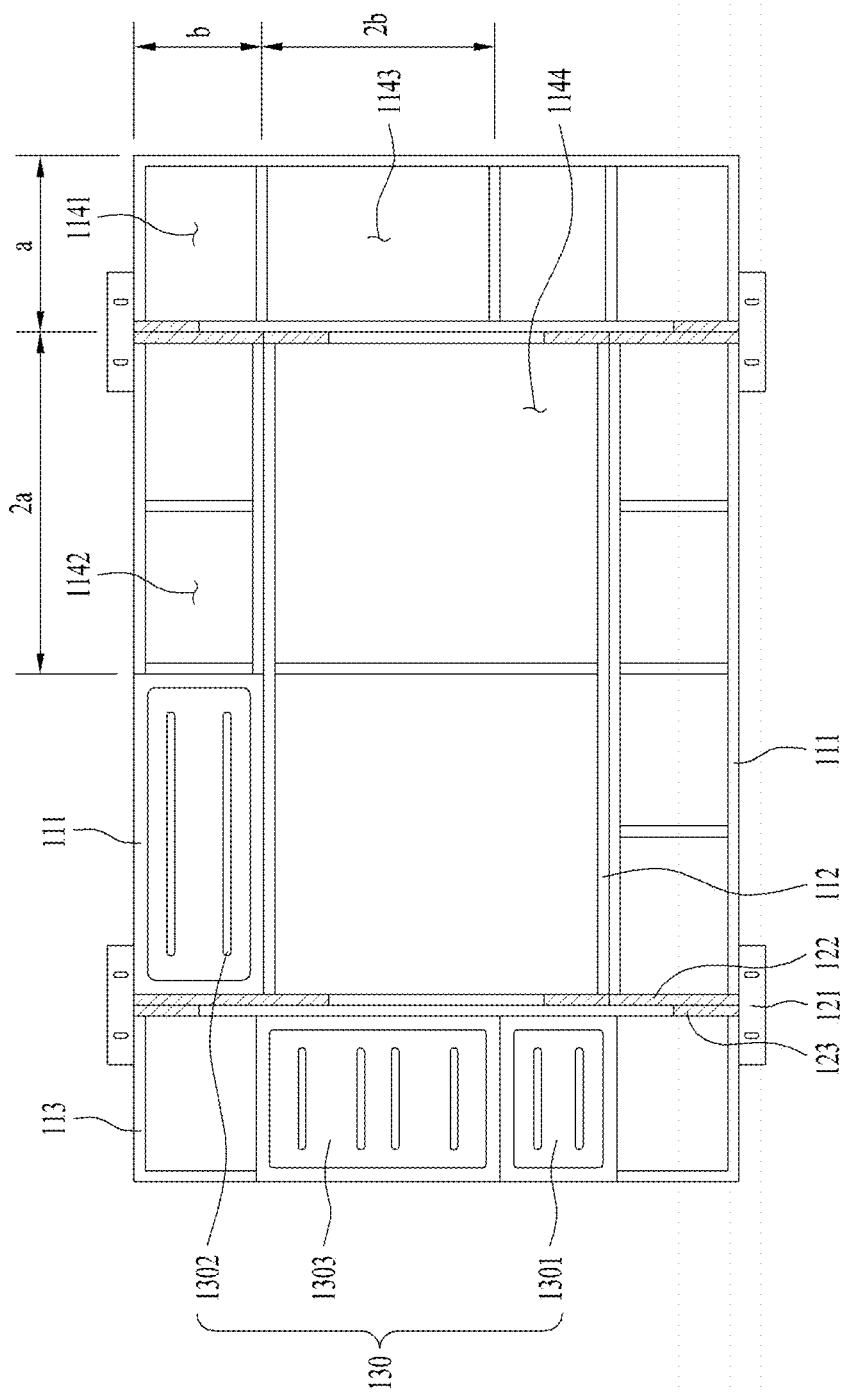
FIG. 7 is a view illustrating a basket of the smart wall according to an embodiment of the present disclosure.

FIG. 7 is a view illustrating a basket 130 of the smart wall 100 according to an embodiment of the present disclosure. The frame modules 111, 112, and 113 may be divided into a plurality of mounting cells 114 using the inner shape steel 115. As shown in FIG. 7, the basket 130 may be inserted into the mounting cells 114 to provide a space in which the electronic appliance 160 is seated. The second frame module 112 has a relatively large mounting cell 1144 because the display device 161 is located therein. On the other end, the mounting cells 114 of the first frame module 111 and the third frame module 113 may be formed to have standardized sizes. Using the mounting cells 114 of the standardized sizes, the basket 130 may also be standardized. Thereby, the number of types of parts may be reduced.

However, when the mounting cells are formed to have the same size, a larger space may be needed depending on the electronic appliance 160 to be mounted. For example, since the size of the air conditioner is different from that of the air cleaner, the mounting cell 114 may be formed to have a size which is an integer multiple of a base size in consideration of the difference in size. For example, based on a first mounting cell 1141 having a horizontal dimension equal to a and a vertical dimension equal to b, a second mounting cell 1142 having a horizontal dimension equal to an integer multiple of a or a third mounting cell 1143 having a vertical dimension equal to an integer multiple of b may be provided.

The horizontal dimension of the first mounting cell 1141 corresponds to the horizontal dimension of the third frame module 113, and the vertical dimension thereof corresponds to the vertical dimension of the first frame module 111. Here, the mounting cell 114 refers to an internal space partitioned by the shape steel 115, and thus the difference in size between the first frame module 111 and the third frame module 113 caused by the thickness of the shape steel 115 is ignored.

Since the first frame module 111 has a short vertical length, the first frame module 111 may include only the first mounting cell 1141 and the second mounting cell 1142. Since the third frame module 113 has a short horizontal length, the third frame module 113 may include only the first mounting cell 1141 and the third mounting cell 1143.

Figure 8:
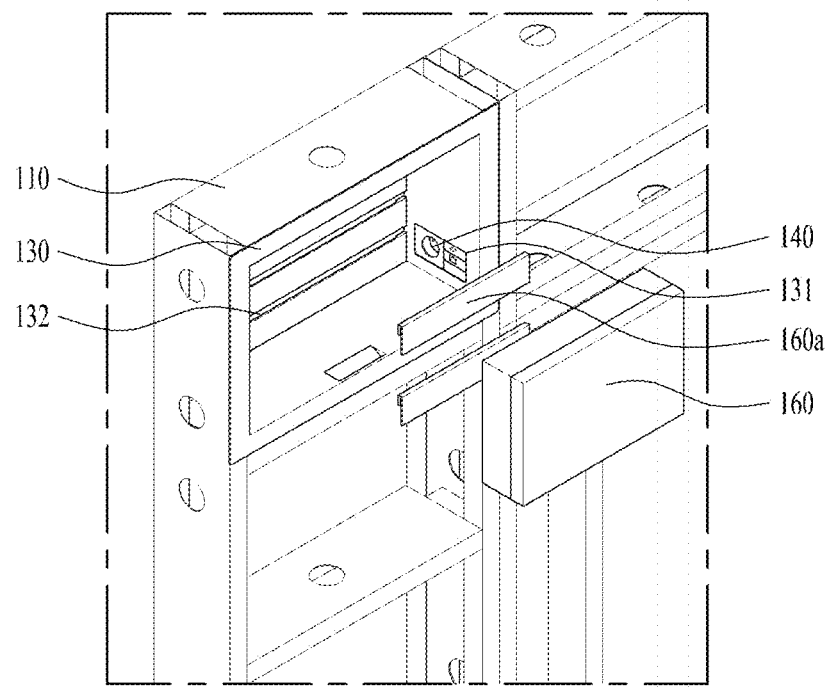
FIG. 8 is a view illustrating a method of mounting the basket of the smart wall and a product according to an embodiment of the present disclosure.
Figure 8:
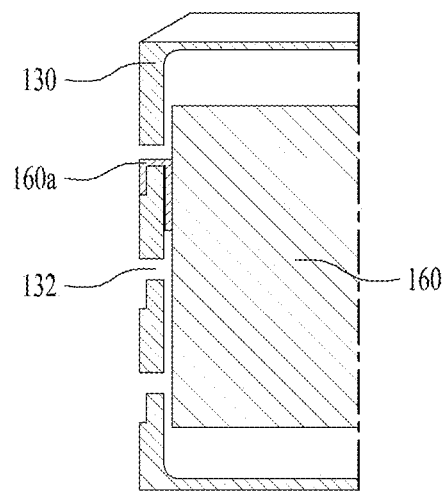

FIG. 8 is a view illustrating a method of mounting the basket 130 of the smart wall 100 and an appliance 160 according to an embodiment of the present disclosure. The basket 130 is a box-shaped member having an open front. The lateral surfaces of the bracket 130 may be fastened to the frame modules 111, 112, and 113. As shown in FIG. 8(a), the bracket 130 may be provided with an opening 131 in the lateral surfaces thereof to expose an outlet for connecting a power cable or a data cable. A fastening structure 132 for fixing the appliance 160 may be included in the basket 130.

A hook groove 132 may be formed in the basket 130 and a hook 160a that may be hooked in the hook groove 132 may be coupled to the back of the electronic appliance 160. Thereby, the electronic appliance 160 may be fastened to the basket 130 as shown in FIG. 8(b).

The electronic appliance 160 may be spaced apart from the basket 130 to discharge heat generated from the electronic appliance 160. The basket 130 may further include an opening for discharging heat, and the hook groove 132 may be formed through the basket 130 in a penetrating manner to discharge heat generated from the electronic appliance 160 therethrough.

Figure 9:
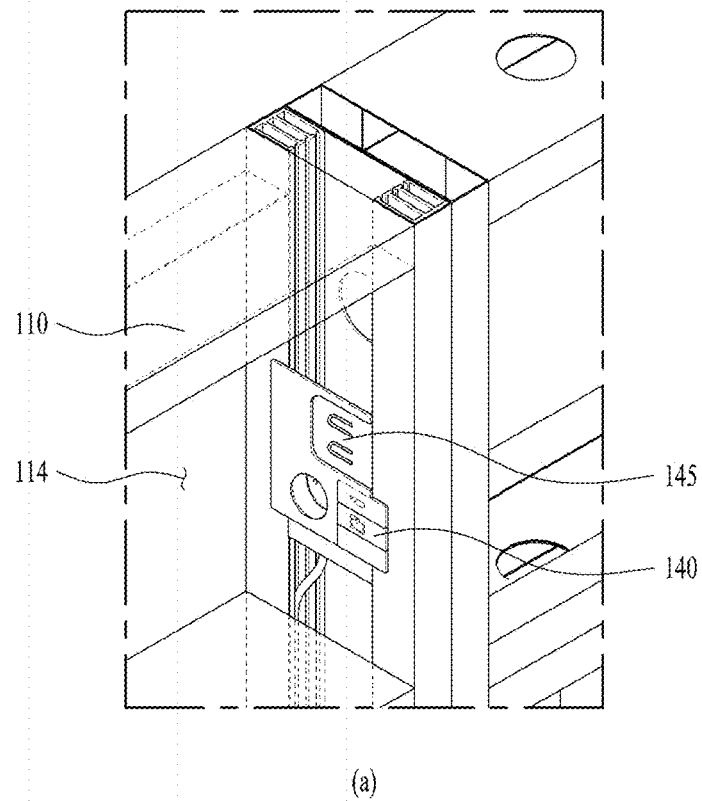
FIGS. 9 and 10 are views illustrating a fixing structure of the basket.
Figure 9:
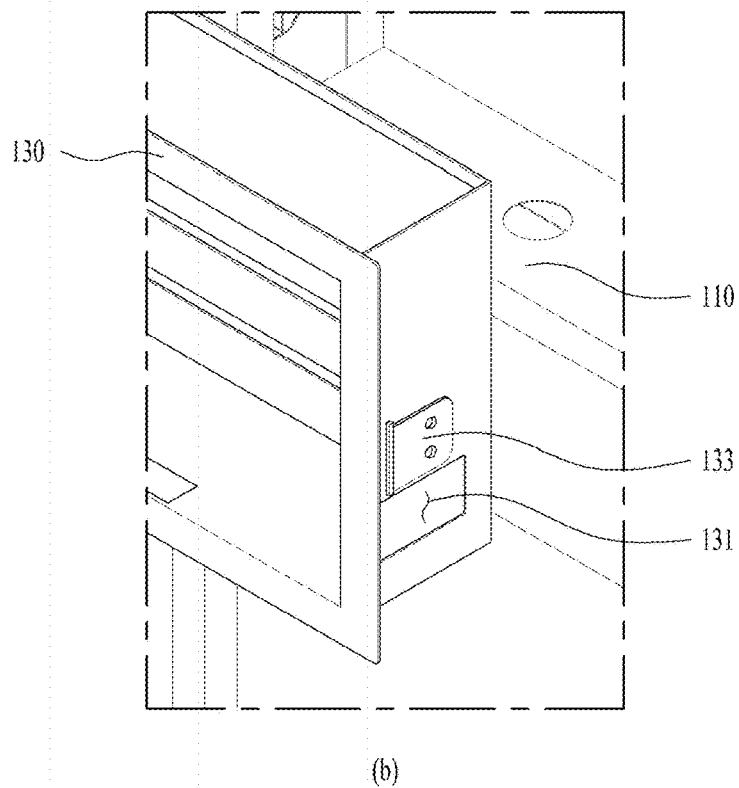
Figure 10:
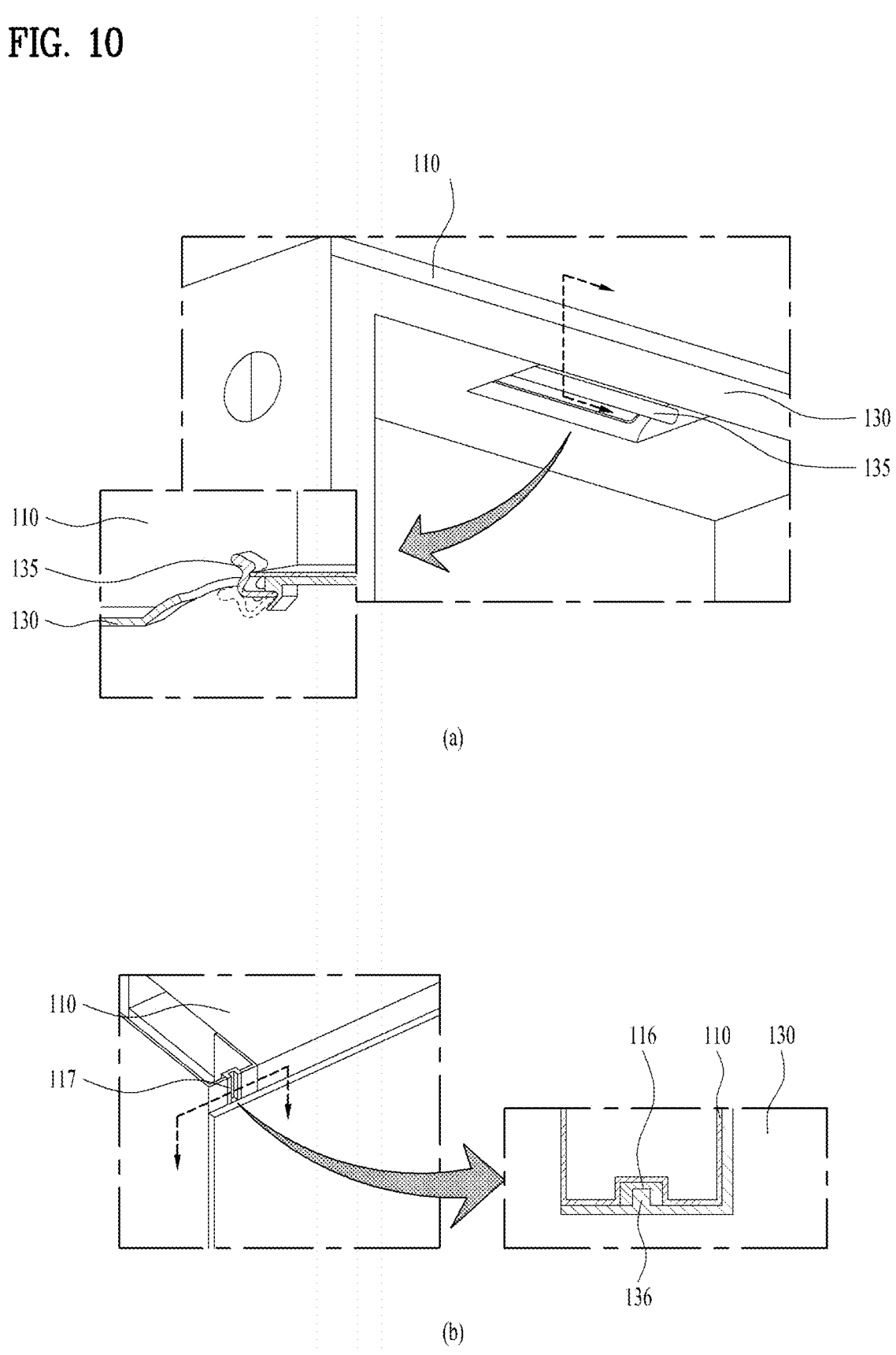

FIGS. 9 and 10 are views illustrating a fixing structure of the basket 130. The basket 130 may further include a fastening structure configured to fix the basket 130 to the frame modules 111, 112, and 113. As shown in FIG. 9(a), a first hook 145 may be disposed on the outlet module 140 arranged in each mounting cell 114, and a second hook 133 may be disposed on the outer surface of the basket 130. As the first hook 145 is integrated with the outlet module 140, the second hook 133 may be arranged adjacent to the opening for exposing the outlet module 140 as shown in FIG. 9(b).

The first hook 145 may be formed on the frame modules 111, 112, and 113. The second hook 133 to be engaged with the first hook 145 may be implemented in a lever shape. The lever-shaped second hook 133 may be hinged to the frame modules 111, 112 and 113. One side of the second hook 133 may be engaged with the first hook 145, and the opposite side thereof may be located inside the basket 130. When the part of the second hook 133 located inside the basket 130 is pulled, the second hook 133 may be separated from the first hook 145 and thus the basket 130 may be removed. When the user inserts the basket 130 into the mounting cell, one side of the second hook 133 may be engaged with the first hook 145. In this embodiment, the second hook 133 may serve as a handle that may be held by hand, and thus enhance convenience in installing or removing the basket 13.

Alternatively, as shown in FIG. 10(b), an elastic member 117 may be coupled to the frame module 111, 112, 113 and a projection 136 to be inserted into the groove formed in the elastic member 117 may be provided to the basket 130. Thus, the basket 130 may be fixed to the frame module 111, 112, 113.

Figure 11:
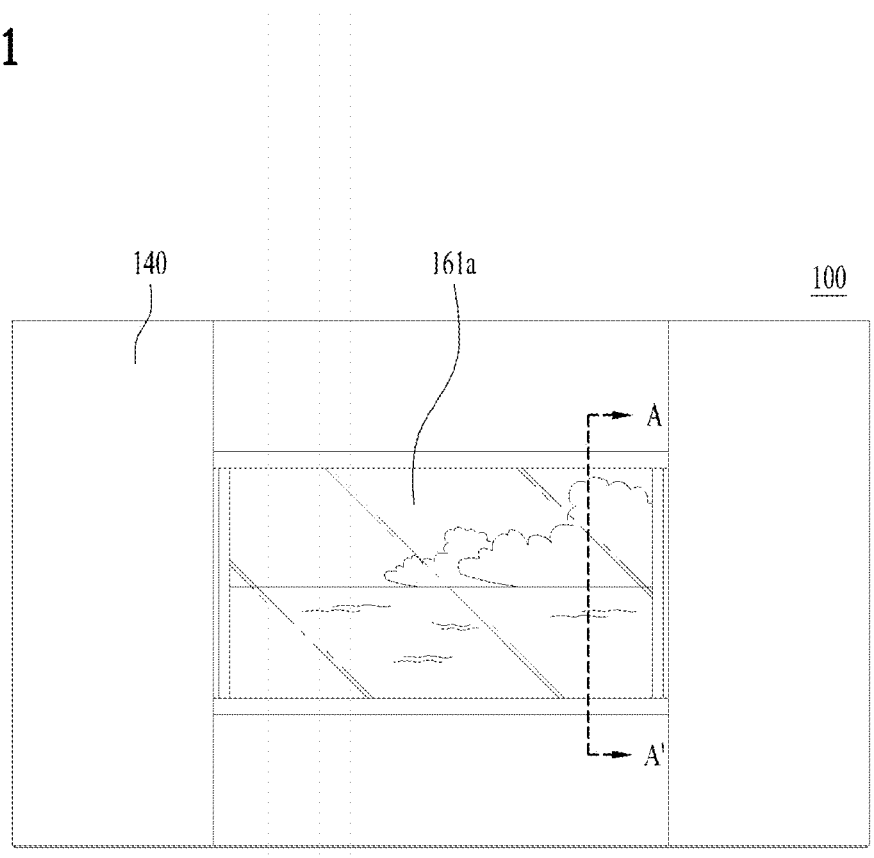
FIGS. 11 and 12 are views illustrating a display of the smart wall according to an embodiment of the present disclosure.
Figure 11:
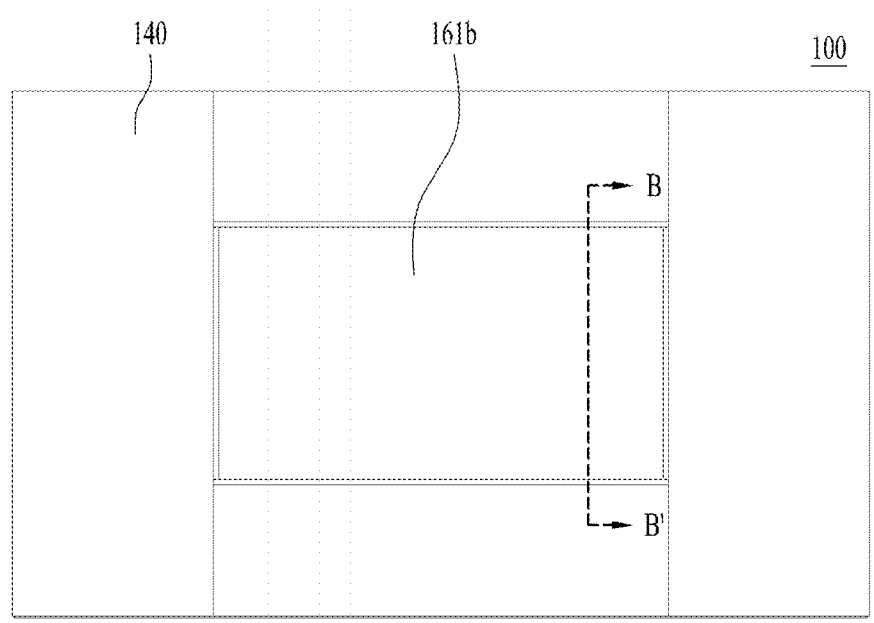
Figure 12:
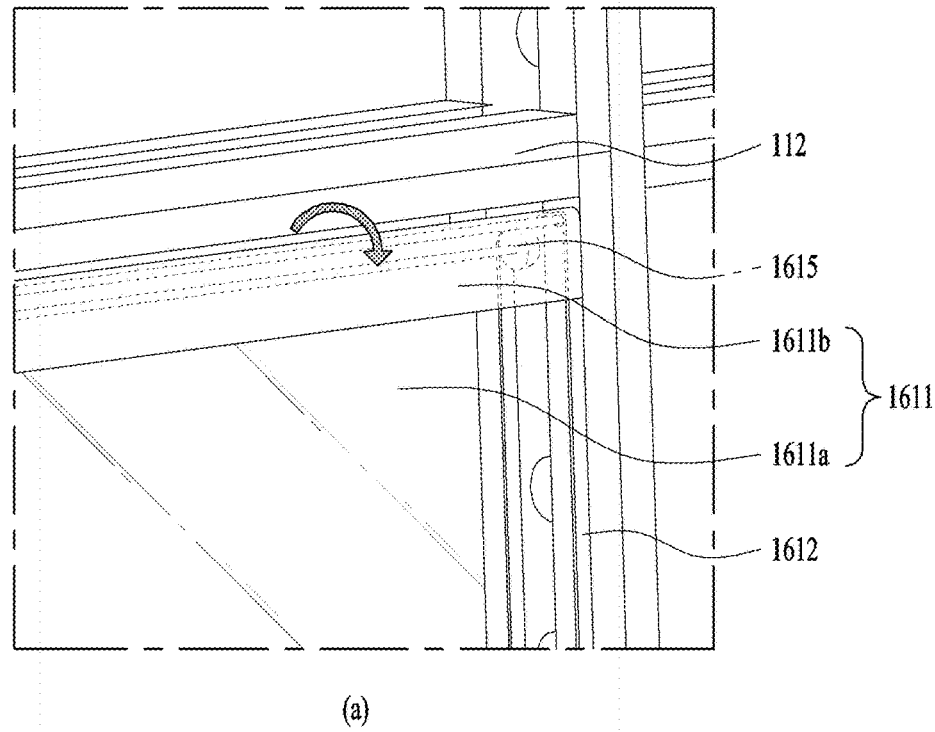
Figure 12:
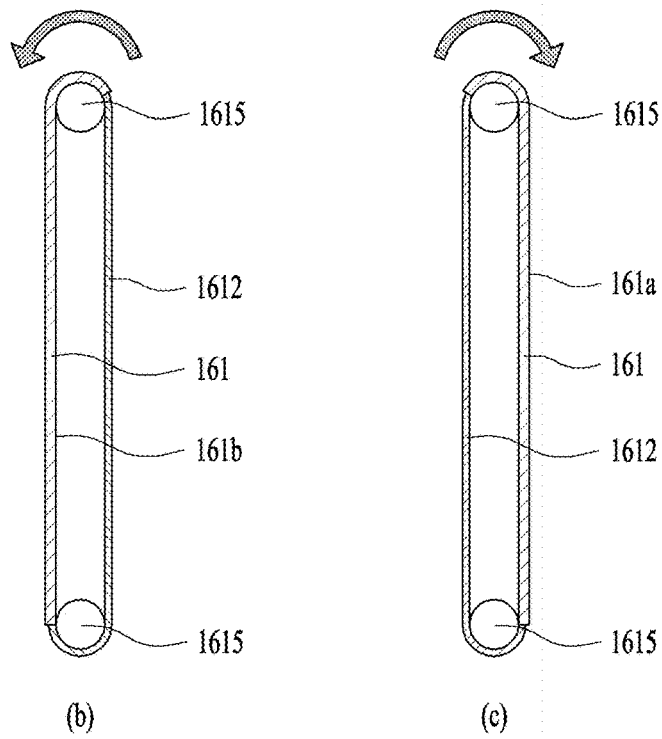

FIGS. 11 and 12 are views illustrating a display 1611 of the smart wall 100 according to an embodiment of the present disclosure. The display device 161 including the display 1611 configured to provide images may be mounted in the second frame module 112, and an opening may be formed in the art wall 150 such that the display 1611 is always exposed. Alternatively, the art wall 150 may be selectively opened and closed to expose the display 1611 of the display device 161. The art wall 150, which covers the display 1611, may be opened or closed in a sliding manner, or may be opened or closed in a rolling manner like a roll blind.

As the display 1611, a flexible display 1611 of a flexible material that is bendable may be employed. The flexible display 1611 refers a lightweight, unbreakable, sturdy display while maintaining the characteristics of a conventional flat panel display. The flexible display is manufactured on a thin and flexible substrate that may be warped, bent, folded, twisted or curled like paper The flexible display 1611 may employ organic light-emitting diodes (OLEDs). Since the OLED generates light by itself, it does not require a backlight unit to supply light. Thus, a flexible material may be used when the OLED is employed. In addition, electronic paper, which represents a display technology providing the characteristics of general inks, uses reflected light, which is the difference from that of a conventional flat panel display. Electronic paper may change information using twisted balls or electrophoresis, which uses capsules.

When the flexible display 1611 is in a undeformed state (hereinafter referred to as a default state) (for example, the flexible display has an infinite radius of curvature), the display area of the flexible display 1611 is flat. When the flexible display 1611 in the default state is deformed by an external force (for example, the flexible display has a finite radius of curvature, hereinafter referred to as a deformed state), the display area may be a curved surface. As shown in the figure, the information displayed in the deformed state may be visual information output on the curved surface. The visual information is implemented by independently controlling light emission of unit pixels (sub-pixels) disposed in a matrix form. The unit pixel refers to a minimum unit for implementing one color.

In the default state, the flexible display 1611 may be in a curved position (for example, a vertically or horizontally curved position) rather than a flat position. In this case, when external force is applied to the flexible display 1611, the flexible display 1611 may be deformed into a flat position (or less curved position) or a more curved position. The flexible display 1611 may be wound around a roll a plurality of times and mounted inside the frame. The flexible display 1611 may be unrolled when the user wants to view an image.

The display device 161 may be implemented by being wound around a roll by only a half turn rather than being wound by a plurality of turns. The display device 161 of this embodiment includes a pair of roller modules 1615 coupled to the second frame module 112, and a chain 1612 wound around the pair of roller modules 1615 and configured to be moved according to rotation of the roller modules, and a flexible display 1611 coupled to the chain 1612 and configured to output an image on a first surface 1611*a* while one side and an opposite side thereof moving in opposite directions.

FIG. 12(*a*) is a view showing one side of the second frame module, FIG. 12(*b*) is a cross-sectional view taken along line A-A of FIG. 11(*a*), and FIG. 12(*c*) is a cross-sectional view taken along line B-B of FIG. 11(*b*). While the roller modules 1615 are illustrated in the drawings as being positioned on the upper and lower portions of the second frame module 112, respectively, the roller modules may be positioned on one side and the opposite side of the second frame module 112 facing away from each other in the horizontal direction. For simplicity, it is assumed that a pair of roller modules 1615 is positioned on the upper and lower portions of the second frame module 112, and the flexible display 1611 is vertically moved.

The roller module 1615 may employ one roller having a large diameter. Alternatively, as shown in FIG. 12, a large roller and a small roller may constitute one roller module 1615. The chain 1612 wound around the pair of roller modules 1615 may form a closed curve as shown in FIG. 12(*b*), and move as the roller modules 1615 rotate.

The roller module 1615 does not need to be formed in the shape of a rod covering the entire one side of the second frame module 112. The roller module 1615 may be configured by positioning discs at both ends of a rotation shaft so as to rotate about the rotation shaft, as shown in FIG. 12(*a*).

The chain 1612 may be formed to be small so as to correspond to the size of the roller modules 1615 as shown in FIG. 12(*a*). To ensure stable movement of the flexible display 1611, a pair of chains 1612 may be provided on both side of the flexible display. In this embodiment, the flexible display 1611 may be moved along a pair of chains 1612 with both left and right ends thereof coupled to the chains 1612. The flexible display 1611 may be moved while being wound around the roller modules 1615.

FIGS. 11(*a*) and 12(*b*) illustrate a first state in which a first surface 1611*a* on which an image is output faces forward. FIGS. 11(*b*) and 12(*c*) illustrate a second state in which a second surface 1611*b* on which an image is not output faces forward as an opposite surface of the first surface 1611*a*. As shown in FIG. 12(*b*), in the first state, the display 1611 may be located inside the frame. As shown in FIG. 12(*c*), in the second state, the display 1611 may be disposed father to the front than in the first state.

In the second state, the second surface 1611*b* of the display 1611 may realize a color and surface harmonized with the art wall 150, thereby implementing a uniform appearance in the second state. In addition, in the second state, the second surface 1611*b* of the display 1611 may be arranged to form the same plane as the art wall 150.

Each device may be provided with a remote controller in order to control the functional units mounted on the smart wall 100. However, in this case, use of the devices may be inconvenient. An integrated remote controller may be used to control the functional units mounted on the smart wall 100 simultaneously. The integrated remote controller may control each device individually. The integrated remote controller may control each functional unit through a set-top box that integrally controls the functional units.

Figure 13:
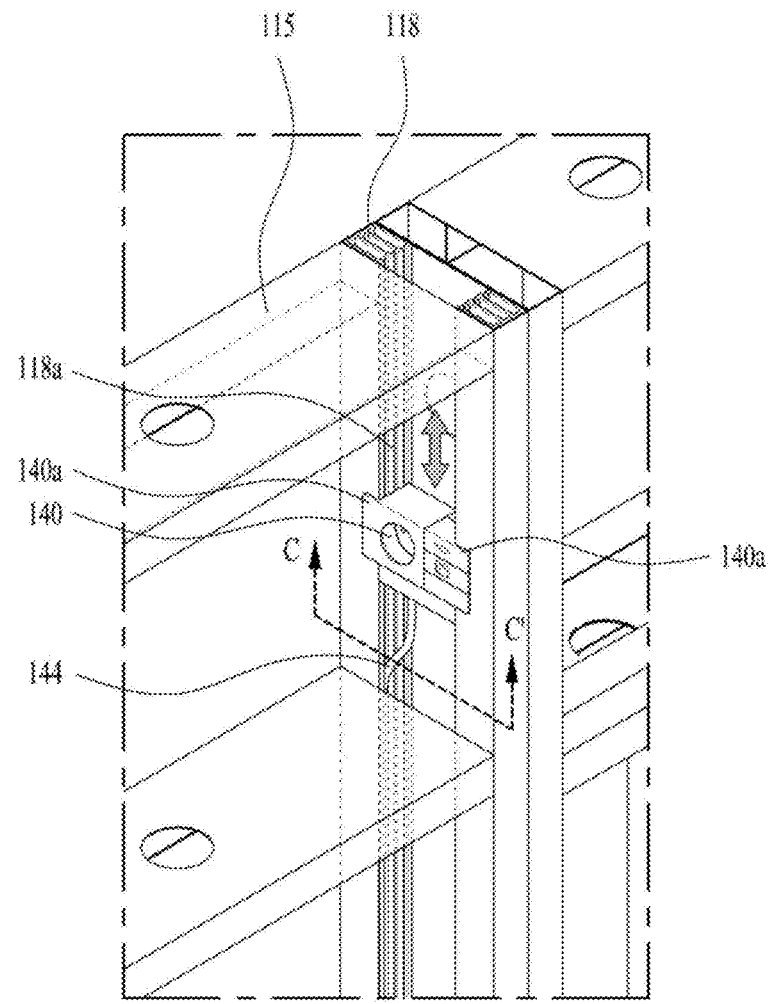
FIGS. 13 and 14 are views illustrating an outlet module and a rail of the smart wall according to an embodiment of the present disclosure.
Figure 14:
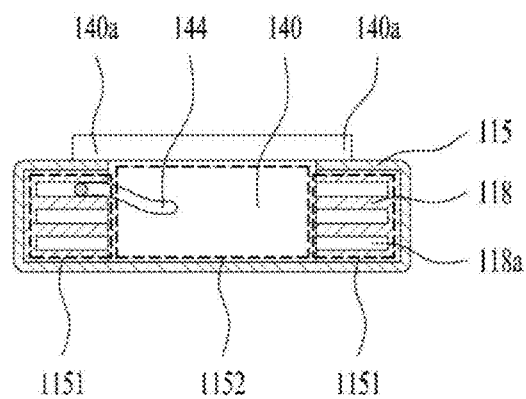
Figure 15:
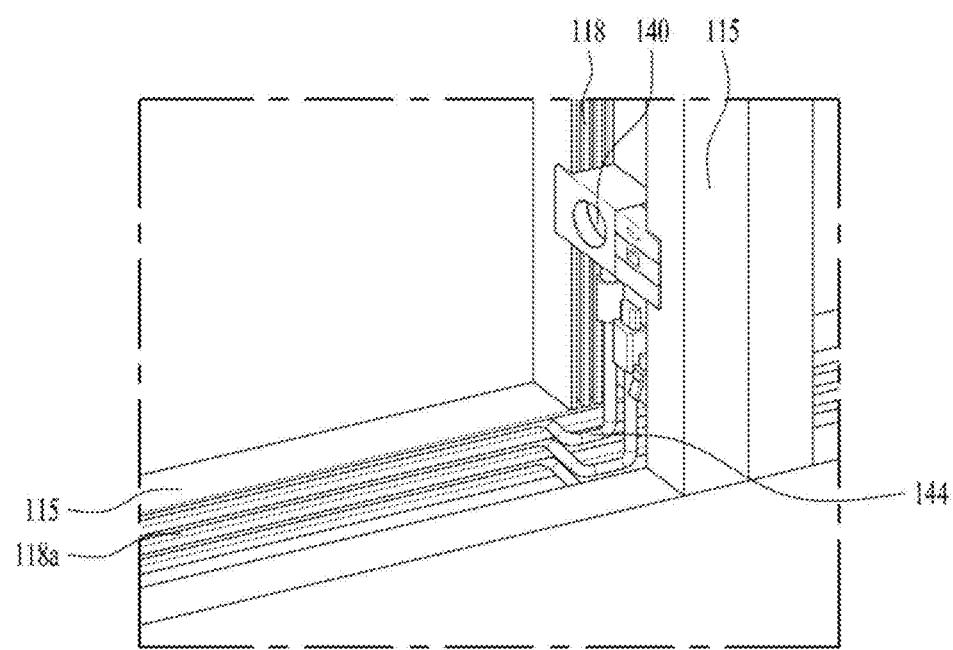
FIG. 15 is a cross-sectional view taken along line C-C of FIG. 13.

FIGS. 13 and 14 are views illustrating an outlet module 140 and a rail 118 of the smart wall according to an embodiment of the present disclosure, and FIG. 15 is a cross-sectional view taken along line C-C of FIG. 13. The outlet module 140 may be inserted in the internal space of the C-shape steel 115 of the frame modules 111, 112, and 113 and may be disposed in a portion of the internal space that is open to the mounting cell 114 such that the outlet module 140 is exposed.

Referring to FIG. 15, the internal space of the C-shape steel 115 has a pair of first internal spaces 1151 enclosed in a square bracket shape on both width sides, and a second internal space 1152 opened to the mounting cell 114 and positioned between the first internal spaces 1151. A pair of rails 118 may be installed in the pair of the first internal space 1151, and the outlet module 140 may be disposed therebetween.

As shown in FIG. 13, the rail 118 may extend in the same direction as extension of the C-shape steel 115 and include at least one cable groove 118*a* extending in the longitudinal direction. A cable 144 connected to the outlet module 140 may be inserted into the groove, and thus the groove may prevent the cable 144 from being twisted and arranged in a disorderly manner. Multiple cable grooves 118*a* may be formed in the rail 118 in parallel with each other to accommodate multiple cables 144. When multiple cables 144 are arranged in the internal space, it is difficult to distinguish between a cable 144 connected to an electronic appliance, a power cable 144, and a data cable 144, which may cause inconvenience in maintenance and assembly. The cables 144 may be inserted into the designated cable grooves 118*a* to prevent confusion between various types of cables 144.

As shown in FIG. 14, the rail 118 may also be installed in a C-shape steel 115 on which the outlet module 140 is not installed. The cables 144 including a cable for supplying power to the outlet module 140, a signal line connected to the outside such as the Internet, and a cable 144 of the plug inserted into the outlet of the outlet module 140 may all be accommodated in the cable grooves 118*a* of the rail 118.

Figure 16:
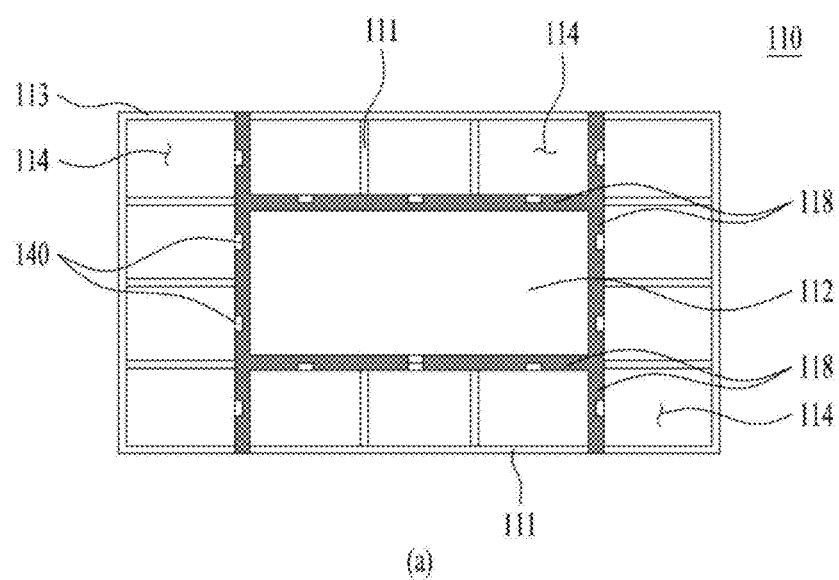
FIG. 16 shows examples of arrangement of C-shape steel including a rail of the smart wall according to an embodiment of the present disclosure.
Figure 16:
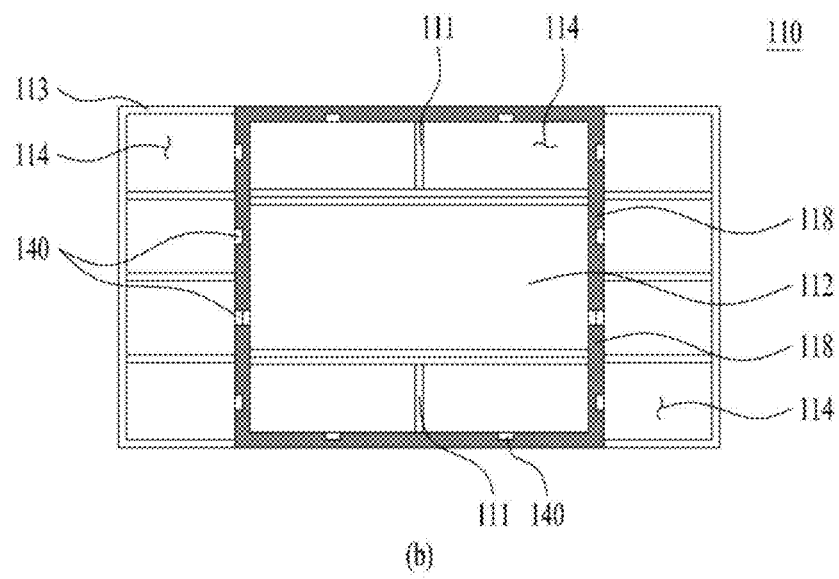

FIG. 16 shows examples of arrangement of the C-shape steel 115 including the rail 118 of the smart wall 100 according to an embodiment of the present disclosure. At least one outlet module 140 is needed in each mounting cell 114, and the rail 118 may be disposed in consideration of a position where the outlet module 140 is disposed.

As described with reference to FIG. 14, a rail may be further installed in a position where the outlet module 140 is not disposed. As shown in FIG. 16, arranging the outlet modules 140 at positions where the first to third frame modules overlap each other may prevent the cables connected to the outlet modules 140 from unnecessarily extending a long distance.

Figure 17:
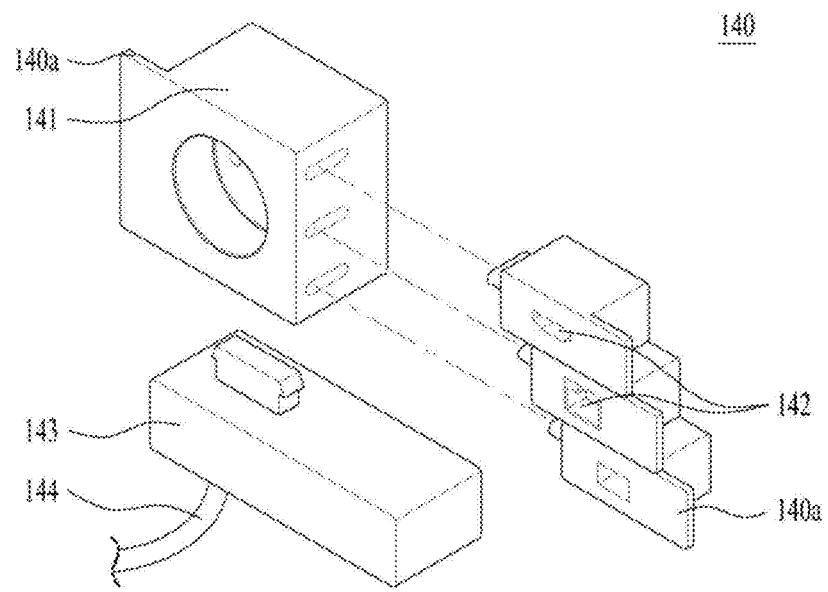
FIGS. 17 and 18 are views illustrating various embodiments of the outlet module of the smart wall according to an embodiment of the present disclosure.
Figure 18:
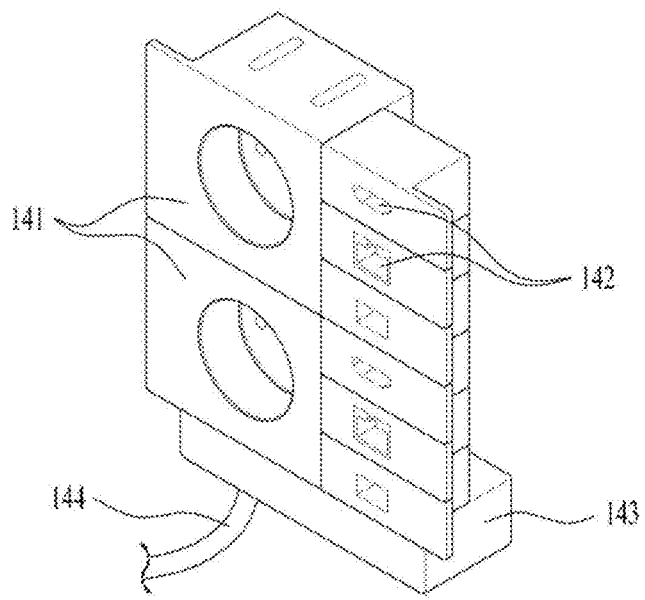

FIGS. 17 and 18 are views illustrating various embodiments of the outlet module 140 of the smart wall 100 according to an embodiment of the present disclosure. The outlet module 140 of the present disclosure may include a base module to which a cable 144 for supplying external power is connected, the power outlet, and a power unit 141 fastened to the base module to supply power to a power plug inserted into the power outlet.

In addition to the power unit 141, a data module including a data port for Internet connection or a data port for connection between multimedia devices may be further added. Since the data port is smaller than the power outlet, multiple data ports may be stacked and arranged beside one power module as shown in FIG. 17.

Accordingly, the power unit 141 may be formed to have a height correspond to N times (an integer multiple of) the height of the data unit 142 to arrange the power unit 141 and the data units 142 side by side on the base unit 143. Alternatively, when two or more power plugs are required or a plurality of data porters is required, the power plugs or data ports may be stacked as illustrated in FIG. 18. Each power unit 141 may provide power supplied from the base unit 143 to another power unit 141 stacked thereon, and thus multiple power units 141 may be connected to one base unit 143.

The outlet module 140 has a width corresponding to the size of the second internal space 1152. An outlet module 140 having a thickness greater than the thickness of the C-shape steel 115 may protrude into the mounting cell 114, and therefore the outlet module 140 may have a size corresponding to the size of the second internal space 1152.

When the outlet module 140 is arranged excessively deep into the second internal space 1152, the outlet module 140 exposed through the opening of the basket may be spaced apart from the opening. Even arranging the outlet module 140 in contact with the basket 130 may cause the outlet module 140 to move into the internal space of the C-shape steel 115 when a plug is inserted.

In order to address such issues, the outlet module 140 may include a wing 140a that extends beyond the entrance of the second internal space 1152. The wing 140a may be located outside the internal space as shown in FIGS. 13 and 15. The wing 140a may support the outlet module 140 such that the outlet module 140 is maintained in contact with the basket without entering the second internal space 1152 even when force is applied to the outlet module 140.

As is apparent from the above description, the smart wall 100 may be installed on a wall at the same height as a multimedia device such as a TV or an audio device mounted thereon, and may therefore provide a tidy appearance.

The size of the smart wall 100 may vary depending on the installation site, and therefore may be customized.

A rail structure and outlets may be used to supply power to each multimedia device and connect the multimedia devices. Thereby, issues such as tangled wiring may be addressed.

The smart wall may be modularized, thereby facilitating mounting of any appliance. When a repair is needed, only a module may be easily removed. Thus, installation and maintenance are simple. Additionally, when a multimedia device or an appliance is added, the smart wall may be easily extended by adding a unit.

Further, it is not necessary to move away unused seasonal appliances into a separate mounting cell 114, which is advantageous in terms of securing space.

The above embodiments should be construed in all aspects as illustrative and not restrictive. The scope of the disclosure should be determined by the appended claims and their legal equivalents, and all changes coming within the meaning and equivalency range of the appended claims are intended to be embraced therein.

What is claimed is:

1. A smart wall comprising:
a plurality of frame modules including at least one mounting cell;
a fastener configured to fasten the plurality of frame modules to each other to form a frame structure;
a fixing member configured to fix the frame structure to a ceiling and a floor;
an electronic appliance disposed in the mounting cell;
an outlet module positioned on a lateral surface of the mounting cell;
a basket inserted into the mounting cell, the basket being open forward of the frame structure and including an opening formed in a lateral surface thereof to expose the outlet module; and
an art wall configured to cover a front surface of the frame structure.

2. The smart wall of claim 1,
wherein the plurality of frame modules comprises at least one of:
a first frame module including mounting cells arranged side by side in a horizontal direction;
a second frame module including a mounting cell larger than the mounting cells of the first frame module; or
a third frame module having a length corresponding to a vertical length of the frame structure and including mounting cells arranged side by side in a vertical direction,
wherein the first frame module and the second frame module are stacked in the vertical direction, and
wherein a horizontal length of the first frame module is equal to a horizontal length of the second frame module.

3. The smart wall of claim 2, wherein a sum of an integer multiple of a vertical length of the first frame module and a vertical length of the second frame module corresponds to a vertical length of the third frame module.

4. The smart wall of claim 2, wherein each of the frame modules is formed by arranging, in a grid, a pair of pieces of vertical steel disposed in the vertical direction and a piece of horizontal steel between the pair of pieces of vertical steel,
wherein the vertical steel and the horizontal steel are C-shape steel having a C-shaped cross-section formed by bending both width ends thereof twice.

5. The smart wall of claim 4, wherein the fixing member comprises:
a fixing bracket fixed to the ceiling or floor;
a coupling bracket coupled to the fixing bracket; and
a first vertical bracket extending in the vertical direction from the coupling bracket and inserted into the vertical steel of the first frame module and the second frame module;
wherein the first vertical bracket is fastened to the first frame module and the second frame module.

6. The smart wall of claim 5, wherein the third frame module is disposed on a side of a stack of the first frame module and the second frame module,
wherein the fixing member further comprises a second vertical bracket inserted into the vertical steel of the third frame module.

7. The smart wall of claim 2, wherein the mounting cells of the first frame module and the third frame module comprise at least one of:
a first mounting cell;
a second mounting cell having a horizontal dimension equal to an integer multiple of a horizontal dimension of the first mounting cell; or
a third mounting cell having a vertical dimension equal to an integer multiple of a vertical dimension of the first mounting cell.

8. The smart wall of claim 7, wherein the second mounting cell is provided in the first frame module, and
wherein the third mounting cell is provided in the third frame module.

9. The smart wall of claim 1, further comprising:
a first hook formed on the frame structure; and
a second hook formed on the basket and fastened to the first hook.

10. The smart wall of claim 9, wherein the first hook is disposed on one side of the outlet module, and
wherein the second hook is disposed outside the basket so as to be adjacent to the opening of the basket.

11. The smart wall of claim 9, wherein the second hook is hinged to the basket,
wherein one side of the second hook is arranged outside of the basket and fastened to the first hook, and an opposite side of the second hook is arranged inside the basket,
wherein, when a user applies force to the second hook, the one side of the second hook is separated from the first hook.

12. A smart wall comprising:
a plurality of frame modules including at least one mounting cell;
a fastener configured to fasten the plurality of frame modules to each other to form a frame structure;
an electronic appliance disposed in the mounting cell;
an art wall configured to cover a front surface of the frame structure;
a pair of roller modules positioned at one side and an opposite side of the mounting cell of the second frame;
a chain wound around the pair of roller modules and configured to move according to rotation of the roller; and
a flexible display coupled to the chain and having a first surface to output an image, the image being output while one side and another side of the flexible display are moved in opposite directions,
wherein a position of the flexible display is switched between a first state and a second state,
wherein, in the first state, the first surface faces forward of the frame structure, and
wherein, in the second state, a second surface of flexible display opposite to the first surface faces forward of the frame structure.

13. The smart wall of claim 12, wherein, in the second state, the second surface is positioned in the same plane as the art wall.

14. A smart wall comprising:
a plurality of frame modules including at least one mounting cell and at least a C-shape steel;
a fastener configured to fasten the plurality of frame modules to each other to form a frame structure; and
an electronic appliance disposed in the mounting cell;
wherein the C-shape steel includes an internal space having an opening at one end thereof toward the mounting cell,
wherein an outlet module is inserted into the internal space and includes a power outlet facing the mounting cell through the opening,
wherein the C-shape steel includes a first portion, two second portions bent at both width ends of the first portion, and two third portions bent at each end of the second portions,
wherein the opening of the internal space is between the third portions,
wherein the internal space comprises a first internal space where the outlet module is mounted, and a pair of second internal spaces respectively at both sides of the first internal space, and
wherein each of the second internal spaces is surrounded by the first portion, one of the two second portions, and one of the two third portions.

15. The smart wall of claim 14, wherein the outlet module comprises:
a base module connected to a cable for supplying external power; and
a power unit including the power outlet and fastened to the base module to supply power to a power plug inserted into the power outlet,
wherein the power unit comprises a plurality of power units stacked in a longitudinal direction of the C-shape steel.

16. The smart wall of claim 15, wherein the outlet module further comprises:
a data unit including a data port allowing a data plug to be inserted thereinto for data communication,
wherein the data unit is arranged on a side of the power unit and stacked on top of the base module.

17. The smart wall of claim 16, wherein a vertical length of the power unit corresponds to an integer (N) multiple of a vertical length of the data unit,
wherein the data unit includes N data units stacked on a side of one of the power units.

18. The smart wall of claim 14, wherein the outlet module further comprises a wing laterally extending from an outside of the opening so as to abut an outer surface of the C-shape steel.

19. The smart wall of claim 14, further comprising a rail located in the second internal space and comprising a cable groove extending in the longitudinal direction of the C-shape steel,
wherein the rail comprises a plurality of rails arranged side by side in a lateral direction of the C-shape steel.

* * * * *